United States Patent [19]

Sun et al.

[11] 4,380,746
[45] Apr. 19, 1983

[54] PULSE MODULATOR USING CAPACITOR CHARGING AND DISCHARGING CIRCUITS

[75] Inventors: Shan C. Sun, Bell, Pa.; Larry L. Church, Jefferson, Ohio

[73] Assignee: Westinghouse Electric Corp., Pittsburgh, Pa.

[21] Appl. No.: 239,917

[22] Filed: Mar. 3, 1981

[51] Int. Cl.$^3$ .............................................. H03K 7/06
[52] U.S. Cl. ................... 332/9 R; 307/108; 307/271; 328/66; 331/153; 332/14; 375/23; 375/44
[58] Field of Search .................. 332/9 R, 9 T, 11 D, 332/14; 331/111, 143, 153; 375/22, 23, 44; 328/59, 66, 67, 68; 307/265, 271, 108

[56] References Cited

U.S. PATENT DOCUMENTS

| | | | |
|---|---|---|---|
| 3,742,384 | 6/1973 | Breitzmann et al. | 331/111 |
| 4,015,213 | 3/1977 | Hamada | 332/9 R X |
| 4,187,439 | 2/1980 | Vesel | 307/271 |
| 4,253,071 | 2/1981 | Underhill et al. | 332/9 T |

Primary Examiner—Siegfried H. Grimm
Attorney, Agent, or Firm—D. R. Lackey

[57] ABSTRACT

A self-starting, non-latching, pulse modulator which will function as an analog divider of first and second input quantities, or as a linear pulse period modulator responsive to one of the quantities, or as a linear pulse frequency modulator responsive to the other of the quantities, depending upon how the first and second input quantities are controlled. The first input quantity is connected to charge a capacitor. The second input quantity is compared in a first comparator with the voltage across the capacitor. A second comparator compares the voltage across the capacitor with a reference voltage. The outputs of the first and second comparators are connected, respectively, to the first and second inputs of a flip-flop which has its first output connected to a monostable multivibrator. The second output of the flip-flop and the output of the monostable multivibrator are both connected so that either one can momentarily activate a discharge circuit for discharging the capacitor.

7 Claims, 3 Drawing Figures

PULSE MODULATOR USING CAPACITOR CHARGING AND DISCHARGING CIRCUITS

BACKGROUND OF THE INVENTION

1. Field of the Invention

The invention relates in general to new improved pulse modulators for converting analog information into a series of pulses.

2. Description of the Prior Art

Many communication channels utilize a modulator which converts analog information to pulses, for transmission to a remote location. The received pulses are demodulated to reconstruct the information into analog form. For example, the pilot protective relay apparatus disclosed in our application Ser. No. 084,218, filed Oct. 12, 1979, now U.S. Pat. No. 4,275,429, which is assigned to the same assignee as the present application, discloses protective relaying apparatus which, in a preferred embodiment, uses pulse period modulation (PPM). In addition to the usual advantages inherent in pulse communication, such as accuracy and reliability, PPM simplifies the demodulator due to the minimal filtering requirements.

While suitable modems for providing the desired modulating function are commercially available, it would be desirable to provide a new and improved pulse modulator which may be easily manufactured for a relatively low cost, and which is free of the start-up and latch-up problems experienced by certain prior art pulse modulators. Also, it would be desirable to provide a versatile pulse modulator which offers application flexibility merely by the selection of certain modes for its input signals.

SUMMARY OF THE INVENTION

Briefly, the present invention is a new and improved pulse modulator which forces the desired oscillatory mode, regardless of how electrical power is initially applied thereto. It does not require either a predetermined edge or level change in the power supply, in order to properly start operation. Circuit oscillation is achieved by charging energy storage means, such as a capacitor, and by discharging the capacitor each time a predetermined relationship occurs between first and second input quantities. Latch-up or failure to oscillate due to failure to discharge the capacitor when the predetermined relationship occurs is prevented by monitoring means. The monitoring means provides an auxiliary discharge signal for discharging the capacitor when the predetermined relationship between the input quantities occurs, but the capacitor is not discharged in response thereto. The new and improved pulse modulator provides application flexibility. By maintaining the first input quantity constant, the modulator provides linear pulse period modulation in response to the magnitude of the second input quantity. By maintaining the second input quantity constant, the modulator provides linear pulse frequency modulation (PFM) in response to the magnitude of the first input quantity. When both input quantities are time varying, the modulator provides a pulse period which is an analog division of the two input quantities.

BRIEF DESCRIPTION OF THE DRAWINGS

The invention may be better understood, and further advantages and uses thereof more readily apparent, when considered in view of the following detailed description of exemplary embodiments, taken with the accompanying drawings in which.

DESCRIPTION OF PREFERRED EMBODIMENTS

Figure 1:
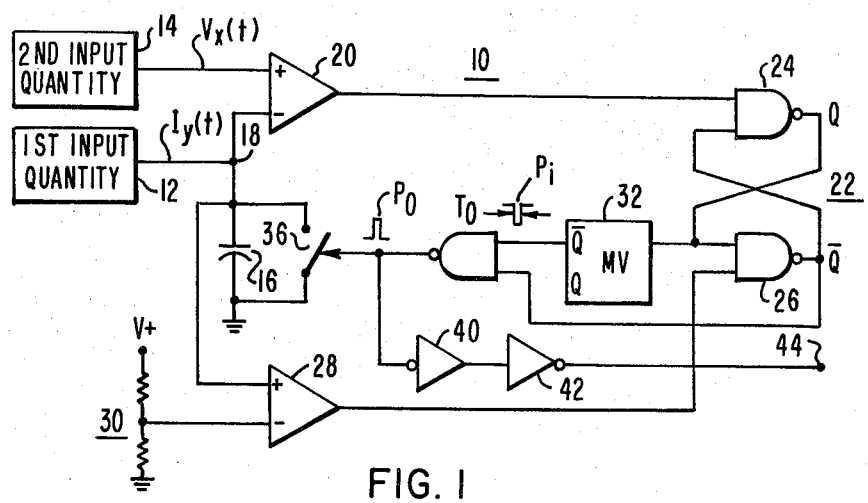
FIG. 1 is a schematic diagram of a pulse modulator constructed according to the teachings of the invention.

Referring now to the drawings, and to FIG. 1 in particular, there is shown a pulse modulator 10 constructed according to the teachings of the invention. Pulse modulator 10 includes a source 12 for providing a first input quantity, and a source 14 for providing a second input quantity. The first input quantity 12 is connected to charge energy storage means, such as a capacitor 16, to provide a changing quantity at terminal 18. The changing quantity at terminal 18 is compared with the second input quantity 14 via a first comparator 20. When the changing quantity, i.e., the charge voltage on capacitor 16, reaches the level of the second input quantity, the output of comparator 20 goes low to set an R-S flip-flop 22.

Flip-flop 22, which may be constructed of crosscoupled NAND gates 24 and 26, is initially in its reset state via the first comparator 20, which is connected to an input of NAND gate 24, and via a second comparator 28. The second comparator 28 compares the changing quantity, i.e., the charge voltage on capacitor 16, with a predetermined small voltage determined by a voltage divider 30. When there is no charge on capacitor 16, the output of comparator 20 is high, i.e., a logic one, and the output of comparator 28 is low, i.e., a logic zero. This relationship resets flip-flop 22 such that NAND gate 24 outputs a logic zero and NAND gate 26 outputs a logic one.

As soon as capacitor 16 starts to charge and the charge voltage exceeds the predetermined small voltage provided by voltage divider 28, the output of comparator 28 goes high to enable flip-flop 22 to be toggled when the output of comparator 20 subsequently goes low to indicate that the charge voltage on capacitor 16 has reached the level of the second input quantity 14.

A monostable multivibrator (MV) or 1-shot 32 is connected to be triggered by NAND gate 24 when flip-flop 22 is toggled, such as by the positive going edge of the output of NAND gate 24. The $\overline{Q}$ input of MV 32 goes low for a very short period of time $T_O$, with the $\overline{Q}$ output being applied to one input of a dual input NAND gate 34. The output of NAND gate 34 is applied to the control input of an analog switch 36. Analog switch 36 has its input and output terminals connected across capacitor 16. Thus, when MV 32 is triggered to drive the output of NAND gate 34 momentarily high, providing a pulse $P_O$, analog switch 36 becomes conductive just long enough to discharge capacitor 16. Switch 36 then becomes non-conductive, as the output of NAND gate 34 goes low at the termination of the MV pulse, $P_i$, to enable capacitor 16 to again start to charge. Thus, the process just described is repeated to sustain the desired circuit oscillation.

The pulse output of modulator 10 may be taken from any convenient circuit location, including the output of comparator 20, the output of one of the NAND gates of flip-flop 22, the Q or $\bar{Q}$ output of MV 32, or the output of NAND gate 34. For purposes of example, the output of NAND gate 34 has been chosen, with inverter gates 40 and 42 applying the output pulse $P_O$ to an output terminal 44.

Start-up and latch-up problems, commonly associated with prior art pulse modulators, have been eliminated by the pulse modulator 10 shown in FIG. 1. Flip-flop 22 and the second comparator 28 cooperatively function as a monitoring means which performs an initialization function which forces oscillation when the power supply which powers the various circuit components is first turned on. This is true, regardless of whether MV 32 is edge or level triggered, because comparators 20 and 28 force flip-flop 22 to its reset state upon power turn-on, which provides a logic zero input to MV 32 until comparator 20 changes its output state. If flip-flop 22 were to be eliminated and the output of comparator 20 applied directly to MV 32, the change in the output of comparator 20 when capacitor 16 charges to the level of the second input quantity 14 during power turn-on may not trigger MV 32. Thus, capacitor 16 would charge and then just "sit there" in the charged state due to a lack of a pulse from MV 32.

In addition to making the pulse modulator 10 self-starting, flip-flop 22 and the second comparator 28 cooperatively monitor the operation of the circuit to prevent circuit latch-up during operation, should MV 32 for some reason fail to be triggered when flip-flop 22 is toggled. As hereinbefore stated, the output of comparator 28 goes from low to high shortly after capacitor 16 starts charging. Thus, when flip-flop 22 is toggled and the output of NAND gate 24 goes high, if MV 32 fails to timely provide a pulse which results in the discharge of capacitor 16, NAND gate 26 will have two high inputs and its output $\bar{Q}$ will be low. This output is tied to the other input of NAND gate 34. Thus, if the input to NAND gate 34 from MV 32 does not go low to force the output of NAND gate 34 high, the input to NAND gate 34 from NAND gate 26 will be low to force the output of NAND gate 34 high. Thus, analog switch 36 is turned on to discharge capacitor 16. As soon as capacitor 16 discharges, comparator 28 will change its output state to a logic zero and the output of NAND gate 26 will go high to terminate the output pulse $P_O$ from NAND gate 34. Thus, the circuit 10 will not latch up should MV 32 fail to provide a timely pulse, as flipflop 22 and comparator 28 cooperatively force the discharge of capacitor 16 in a timely manner. The selection of the output of NAND gate 34 for providing the output pulses from pulse modulator 10 thus assures that there will be no missing pulses in the output train of pulses, which might occur had the Q, or $\bar{Q}$, output of MV 32 been selected to provide the output pulses.

Assuming that the first and second input quantities provide functions $I_y(t)$ and $V_x(t)$, respectively, the pulse period $T(t)$ is given by the relationship:

$$T(t) = T_0 + \frac{CV_x(t)}{I_y(t)}, \quad (1)$$

where $T_O$ is the time width of the output pulse $P_i$ of MV 32, and C is the capacitance of capacitor 16. If $T_O$ is made very small in comparison with the desired range of operation, equation (1) is substantially equal to:

$$T(t) = \frac{CV_x(t)}{I_y(t)}, \quad (2)$$

If both the first and second input quantities $I_y(t)$ and $V_x(t)$ are time varying, the output pulse period is responsive to an analog division of $V_x(t)$ by $I_y(t)$, as set forth in equation (2), and thus the pulse modulator 10 functions as an analog divider.

If the first input quantity $I_y(t)$ is constant, i.e., a constant current source, it will be noted that the pulse period $T(t)$ is directly proportional to the magnitude of the second input quantity $V_x(t)$, and thus the pulse modulator 10 functions as a linear pulse period modulator (PPM). In other words, with a constant current charging source, a capacitor time constant is linearly proportional to capacitor voltage, as expressed by equation (2).

Since frequency is the reciprocal of period, equation (2) may be written:

$$F(t) = \frac{I_y(t)}{CV_x(t)}, \quad (3)$$

where $F(t)$ is the pulse frequency. If the second input quantity $V_x(t)$ is held constant, the pulse modulator 10 will function as a linear frequency modulator.

The pulse modulator 10 shown in FIG. 1 may be modified to supply a nominal period, or a nominal frequency, when $I_y(t)$, or $V_x(t)$, respectively, is equal to zero, by proper biasing, i.e., by injecting a D.C. component into $V_x$ or $I_y$, or both. This modification allows $V_x(t)$ and $I_y(t)$ to be bi-polar.

Figure 2:
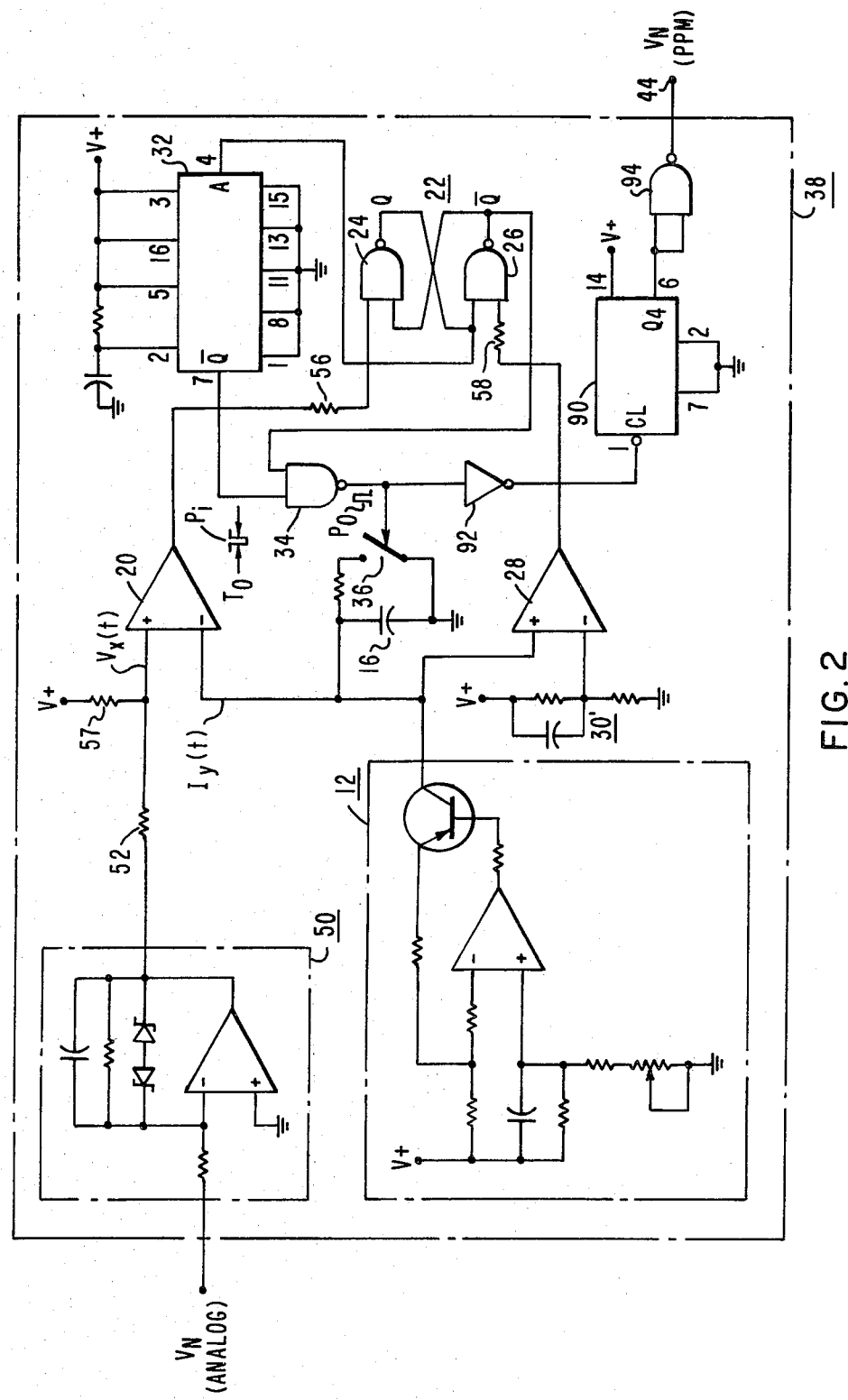
FIG. 2 is a PPM embodiment of the pulse modulator shown in FIG. 1, suitable for a protective relaying application.

FIG. 2 is a schematic diagram which illustrates the use of the pulse modulator 10 shown in FIG. 1 of the present application, in the transmitter 32 shown in FIG. 1 of our hereinbefore-mentioned copending application Ser. No. 084,218 (U.S. Pat. No. 4,275,429). This copending application is hereby incorporated by reference into the present application in order to supply the remaining description of a complete protective relaying function which may advantageously utilize the present invention. In the embodiment of FIG. 2, the first input quantity $I_y(t)$ is a constant current source, and thus the pulse modulator functions as a linear pulse period modulator. The second input quantity $V_x(t)$ is provided by the current derived voltage signal $V_N$ which is obtained from the sequence filters which combine the positive, negative and zero sequence currents of the 3-phase electrical transmission system, to provide a single-phase voltage signal $V_N$. Signal $V_N$ is sent to a remote terminal via PPM on any suitable communication channel, such as an optical fiber link, telephone, power line carrier, or microwave, where it is demodulated and compared with a similarly derived signal $V_F$. In like manner, signal $V_F$ is modulated via a similar pulse period modulator and sent to the local terminal where it is demodulated and compared with signal $V_N$. The functions of FIG. 2 which are the same as those of FIG. 1 are given like reference numerals, and the functions which are only slightly modified are given the same reference numerals along with a prime mark.

More specifically, signal $V_N$ is conditioned in amplifier 50 and applied to the non-inverting input of comparator 20 via resistor 52. Suitable bias is provided via a voltage source V+ which is connected to the noninverting input via a resistor 57. This permits signal $V_N$ to be bi-polar, as hereinbefore explained. The first input quantity 12, which is a constant current source, is connected to charge capacitor 16, and the charge on capacitor 16 becomes an input of comparator 20. The output of comparator 20 is connected to the set input of flip-flop 22 via a resistor 56.

The second comparator 28 compares the charge on capacitor 16 with a predetermined voltage provided by a voltage divider 30', and the output of comparator 28 is connected to the reset input of flip-flop 22 via a resistor 58.

The Q output of flip-flop 22 is connected to the trigger input of MV 32, which for purposes of example is illustrated as being one-half of Motorola's Dual Precision Monostable Multivibrator MC14538B. The $\overline{Q}$ output of MV 32 is connected to one input of NAND gate 34, and the output of NAND gate 34 is connected to the control input of analog switch 36, which may be one of the switches in RCA's Quad Bilateral Switch CD4066, for example.

Figure 3:
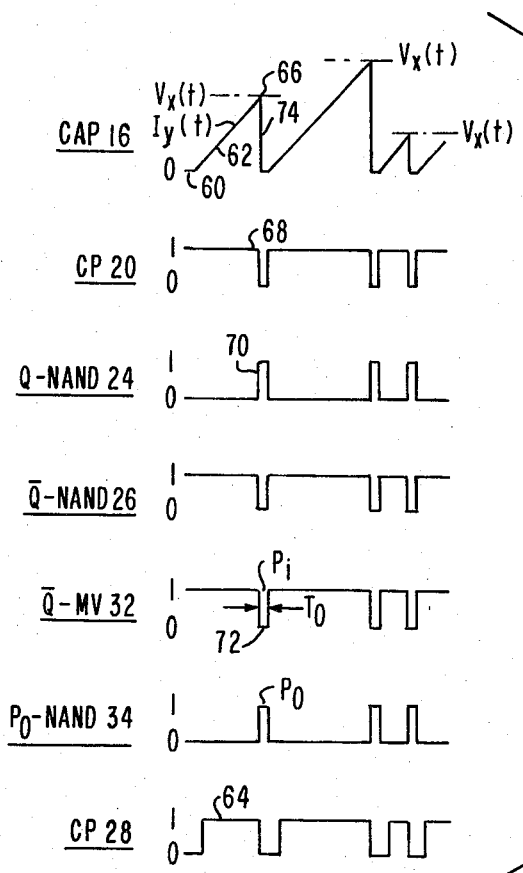
FIG. 3 is a graph illustrating waveforms useful in understanding the operation of the pulse modulator shown in FIG. 2.

FIG. 3 is a graph which illustrates some of the waveforms developed in the transmitter 38 shown in FIG. 2. Upon circuit start-up, the output of comparator 20 is a logic one and the output of comparator 28 is a logic zero, which resets flip-flop 22 such that the Q and $\overline{Q}$ outputs are logic zero and logic one, respectively. The charge on capacitor 16 starts at zero at point 60 and the charge voltage, which is proportional to $I_y(t)$, increases linearly along curve portion 62. When curve portion 62 reaches the voltage provided by voltage divider 30', the output of comparator 28 switches from logic zero to logic one at point 64, to enable flip-flop 22. Capacitor 16 continues to charge and when curve portion 62 reaches a level $V_x(t)$ responsive to signal $V_N$ at point 66, the output of comparator 20 switches low at point 68. Flip-flop 22 is toggled and the positive going edge 70 of its Q output triggers MV 32 to provide a pulse 72, which is the same as pulse $P_i$, having a logic zero time duration of $T_O$. Logic zero pulse 72 causes NAND gate 34 to provide a logic one pulse $P_O$ which closes switch 36 to discharge capacitor 16 along curve portion 74. Comparators 20 and 28 then revert to their logic one and logic zero outputs, respectively, to reset flip-flop 22 and enable the cycle to be repeated.

The frequency range of the pulse modulator circuit is deliberately selected to be high, such as about a 110 KHz center frequency, for example. This relatively high frequency reduces the size of the circuit components, and is also needed for encoding due to capacitance and current source level limitations. In order to provide a flexible frequency interface, a divide-by-N counter 90 may be provided to obtain the desired frequency range for the specific communication link to be used, which is hereinbefore stated may be a fiber optic link, a telephone data channel, a microwave link, or a power line carrier link, for example. For purposes of example, the divide-by-N counter 90 is illustrated as being Motorola's Seven Stage Ripple Counter MC14024B. If the output of NAND gate 34 is selected to provide the output pulses to be divided, the pulses are inverted via an inverter gate 92 and applied to the clock input of counter 90. The appropriate Q output of counter 90 is selected as the output, depending upon the division required, and the output is inverted via gate 94 and applied to the output terminal 44 for transmission over the communication channel.

In summary, there has been disclosed a new and improved self-starting pulse modulator which may be easily constructed of relatively low-cost components. In addition to being self-starting, the pulse modulator is free of latch-up problems which may be associated with failure of a monostable multivibrator to provide a timely pulse. The pulse modulator of the invention is versatile in that it may be used as an analog divider of two time varying inputs, a linear pulse period modulator, or a linear pulse frequency modulator, merely by proper selection of the input signals. A divide-by-N counter on the output of the pulse modulator provides interface flexibility for properly matching the selected communication channel.

We claim as our invention:

1. A pulse modulator for providing pulses having a predetermined parameter proportional to at least one input quantity, comprising:
   a first input quantity,
   energy storage means,
   said energy storage means being charged by said first input quantity to provide a changing quantity,
   a second input quantity,
   first means comparing said second input quantity and said changing quantity, said first means providing a predetermined signal when the compared quantities have a predetermined relationship,
   second means responsive to the predetermined signal being provided by said first means for providing a first discharge signal,
   third means responsive to the predetermined signal being provided by said first means for providing a second discharge signal,
   fourth means for discharging said energy storage means in response to either of the discharge signals, and for immediately enabling said energy storage means to be charged by said first input quantity,
   and output means providing a pulse in response to each occurrence of the predetermined relationship between the compared quantities.

2. The pulse modulator of claim 1 wherein both the first and second input quantities are time varying quantities, wherein the pulse modulator is responsive to an analog division of the compared quantities.

3. The pulse modulator of claim 1 wherein the first input quantity is a constant source, and the second input quantity is time varying, wherein the pulse modulator is a linear pulse period modulator responsive to the magnitude of the second input quantity.

4. The pulse modulator of claim 1 wherein the second input quantity is a constant source and the first input quantity is time varying, wherein the pulse modulator is a linear pulse frequency modulator responsive to the magnitude of the first input quantity.

5. The pulse modulator of claim 1 wherein the output means includes divider means for providing pulses at a lesser rate than the rate at which the predetermined relationship between the compared quantities occurs.

6. The pulse modulator of claim 1 including means for injecting a constant D.C. component into at least one of the input quantities to provide a predetermined nominal modulation when one of the input quantities is equal to zero.

7. The pulse modulator of claim 1 wherein the first means includes a first comparator, the second means includes a first logic gate and a one-shot multivibrator, the third means includes a second logic gate and a second comparator, and the fourth means includes a third logic gate and a switch connected across the energy storage means whose conductive state is responsive to the output of the third logic gate, with the first and second logic gates being connected as an R-S flip-flop having set and reset inputs, with the outputs of the first and second comparators being connected to the set and reset inputs, respectively, of said R-S flip-flop, and wherein the second comparator resets, and then enables said R-S flip-flop in response to the energy storage means having a predetermined amount of energy stored therein, such that when the first means provides a predetermined signal the R-S flip-flop sets to provide the first discharge signal for the third logic gate via said first logic gate and said one-shot multivibrator, and to provide the second discharge signal for said third logic gate via said second logic gate.

* * * * *